US006639782B2

United States Patent
Lin

(10) Patent No.: US 6,639,782 B2
(45) Date of Patent: Oct. 28, 2003

(54) PROTECTING CIRCUIT OF THE SEMICONDUCTOR FACTORY AUTOMATION

(75) Inventor: Wen-Yung Lin, Taichung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 182 days.

(21) Appl. No.: 09/985,056

(22) Filed: Nov. 1, 2001

(65) Prior Publication Data

US 2003/0081368 A1 May 1, 2003

(51) Int. Cl.[7] .............................................. H01H 47/24
(52) U.S. Cl. ........................ 361/173; 361/23; 361/100; 361/115
(58) Field of Search .......................... 361/23, 100, 173, 361/115, 183, 160

(56) References Cited

U.S. PATENT DOCUMENTS 5,907,464 A * 5/1999 Maloney et al. ............ 361/111
5,930,094 A * 7/1999 Amerasekera et al. ........ 361/56
6,055,141 A * 4/2000 Dorschky et al. ............. 361/25
6,172,864 B1 * 1/2001 Bremond et al. ........... 361/119
6,239,958 B1 * 5/2001 Kato et al. ..................... 361/56

* cited by examiner

Primary Examiner—Anthony Dinkins

(57) ABSTRACT

First of all, a processing apparatus that is utilized in the semiconductor industry, a protecting circuit and an automatic running apparatus having the standardized mechanical interface (SMIF) are provided. The protecting circuit includes: a voltage-induction device, a logical device and two electric-lighting devices. The protecting circuit receives the signals from the processing apparatus by the voltage-induction device, and the protecting circuit utilizes the logical device to perform a logical calculation in accordance with the signals from the processing apparatus. Furthermore, the states of operating the processing apparatus are shown in two electric-lighting devices, and the logical signals are transported from the protecting circuit into the standardized mechanical interface (SMIF) to control the operation of the robotic arm in the automatic running apparatus.

11 Claims, 3 Drawing Sheets

PROTECTING CIRCUIT OF THE SEMICONDUCTOR FACTORY AUTOMATION

BACKGROUND OF THE INVENTION

1. Field of the Invention

The present invention generally relates to a protecting circuit of the semiconductor factory automation, and more particularly to a circuit for protecting a processing tool and a robotic transfer apparatus with standardized mechanical interface (SMIF), which is automatically activated to disable the load/unload function of the robotic transfer apparatus if the processing tool is not in a proper operating condition.

2. Description of the Prior Art

The need for reduced cost per unit wafer processed drives the semiconductor industry continuously to search for ways to increase wafer yield and reduce production cycle time. It is well recognized that overall semiconductor wafer fabrication system productivity increases are achieved by ensuring a constant supply of wafers at each tool, thus, the transaction capability of the factory material handling system affecting the number of wafer carriers circulating in a factory. As the wafer size has increased, the handling of wafers has become more limited to factory automation, instead of manual handling, to accommodate the increase in size and weight of wafer pods. In other words, the transaction of an interface apparatus transferring a wafer or a wafer cassette into a processing or metrology tool becomes more and more important and complicated.

Semiconductor wafer handling and processing have always required extreme care to avoid contamination due to ambient and process-born particles. Such contamination lowers process yields, thus making the manufacture of integrated circuits more expensive and time consuming. The standardized mechanical interface (SMIF) system is developed not only to facilitate semiconductor wafer fabrication, but also to reduce particle fluxes onto semiconductor wafers during storage and transport of the wafers through the semiconductor fabrication process. A standardized mechanical interface (SMIF) system has three main components: sealed pods used for storing and transporting wafer cassettes, a mini-environment supplied with ultraclean air flows surrounding cassette load ports and wafer processing areas of processing stations so that the environments inside the pods and mini-environment become miniature clean spaces, and robotic transfer assemblies to load/unload wader cassettes and/or wafers from the sealed pods to the processing toll without contamination of the wafers in the wafer cassette from external environment. The standardized mechanical interface (SMIF) system is therefore an effective interface between an operator and the process tool providing a continuous, ultra-clean environment for the wafers as they move through the wafer fab.

Recently, robotic apparatus and other machines having a standardized mechanical interface (SMIF) apparatus is designed to integrate wafer cassette loading and unloading into a wafer processing and metrology tools. Thus, the operation interface is becoming more complicated. The use of safety sensors for detecting whether the interface apparatus is in a proper operating condition is belonged to the control interface of the machines itself, and the complicated operation interface between the robotic apparatus and the processing tool puts a burden on an operator resulting in improper operation. For example, if the platform of the processing tool is not ready (or not "home") that is not detected by the safety sensors of the robotic machine, and the operator starts the unloading operation, the wafer and either the robotic machine or the processing tool can be damaged. On the other hand, the loading/unloading apparatus has a robotic arm. In general, the manufacturers of the loading/unloading apparatus and the processing apparatus are difference, so that the operator makes a mistake about the work to result in the miss-operation between the robotic arm and the processing apparatus. These artificial faults always make the robotic arm collide with the processing apparatus or the boats on the processing apparatus, it causes the processing apparatus or the boats to be damaged, and hence, addition of the costs very much.

While lots of alarms of the control interface have been generally useful, but the aim to simplify the operation interface and to reduce the burden of the operator for preventing improper operation or miss-operation is continuously demanded. Thus, it is a desire to provide a system and a method for protecting the interface apparatus from damage due to improper operation or miss-operation by a foolproof protection system between the processing tool and the interface apparatus.

In accordance with the above description, a new and improved protecting circuit system between the processing apparatus and the standardized mechanical interface (SMIF) is therefore necessary, so as to raise the stability of the operation between the processing apparatus and standardized mechanical interface (SMIF), and to reduce the artificial faults and maintained cost.

SUMMARY OF THE INVENTION

In accordance with the present invention, a protecting circuit system is provided that substantially overcomes the drawbacks of the above mentioned problems between the processing apparatus and standardized mechanical interface (SMIF) by using existing conventional operation.

Accordingly, it is a main object of the present invention to provide a protecting circuit system between the processing apparatus and standardized mechanical interface (SMIF). This invention can install a protecting circuit between the processing apparatus and standardized mechanical interface (SMIF) to avoid the miss-operation that cause damage to the equipments, and the protecting circuit also raise the stability for operating the equipments. Thus, this invention can reduce the maintainable cost of the conventional apparatus in order to correspond to economic effect. Therefore, the present invention is appropriate for deep sub-micron technology in providing semiconductor apparatus.

Another object of the present invention is to provide a protecting circuit. The protecting circuit of the present invention can catch the outputted signals from the processing apparatus, and the outputted signals is logically calculated by way of using a logical device to produce a local controlling signal, the protecting circuit then transports the local controlling signal into the standardized mechanical interface (SMIF) to control the operation of the robotic arm. In order to avoid affecting the current that is used to operate the apparatus, the protecting circuit utilizes the metal-oxide semiconductor (MOS) device having the property of the voltage induction to catch the signals and the Transistor-to-Transistor Logic (TTL) having the property of the current induction to drive the equipment. Therefore, the present invention is a device that can correspond to the requirement of the industry.

In accordance with the present invention, a protecting circuit between the processing apparatus and the standardized mechanical interface (SMIF) is disclosed. First of all, a processing apparatus that is utilized in the semiconductor industry, a protecting circuit and an automatic running apparatus having the standardized mechanical interface (SMIF) are provided. The processing apparatus comprises a carrying platform that can free rotate itself, and the processing apparatus itself can product two singles in accordance with the load/unload states: one signal is a goods-stated signal (Pr) that is outputted from an output terminal of the goods-stated signal; another signal is a stage-stated signal (H) that is outputted from an output terminal of the stage-stated signal. When the carrying platform has no goods thereon, a goods-stated signal that is transported from the processing apparatus is ⌈0⌋, otherwise the goods-stated signal is ⌈1⌋. When the carrying platform itself rotates to a direction that is not located on the site for carrying the goods, a stage-stated signal that transported from the processing apparatus is ⌈0⌋, otherwise the stage-stated signal is ⌈1⌋. Furthermore, the automatic running apparatus with the standardized mechanical interface (SMIF) comprises: a robotic arm, a placing device and a circuit system having a plurality of linking ports.

Moreover, the protecting circuit comprises: a voltage-induction device, a logical device and two electric-lighting devices, wherein the voltage-induction device comprises a plurality of not gates, and the logical device comprises a plurality of or gates, and two electric-lighting devices comprises a light-emitting diode (LED). The input terminations of the voltage-induction device are connected with the output terminal of the goods-stated signal and output terminal of the stage-stated signal of the processing apparatus, so as to receive the signals from the processing apparatus into the protecting circuit. The input terminations of the logical device are connected with the output terminations of the voltage-induction device, so as to logically calculate the signals from the processing apparatus. A part of the output terminations of the logical device are connected with two electric-lighting devices, so as to display the state of operating the processing apparatus, and the other of the output terminations of the logical device are connected with the plurality of linking ports of the circuit system in the automatic running apparatus with the standardized mechanical interface (SMIF) to control the operation of the robotic arm in the automatic running apparatus with the standardized mechanical interface (SMIF)

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
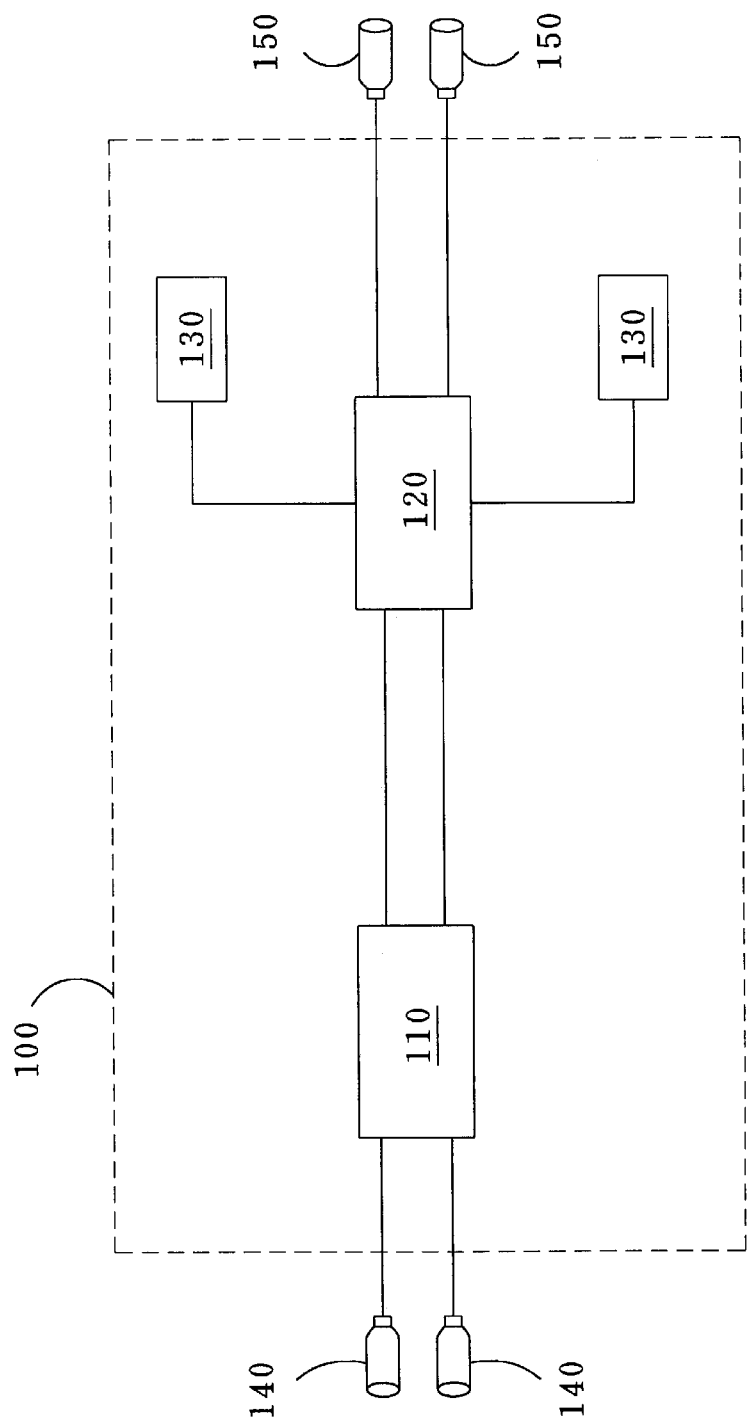
FIG. 1 shows cross-sectional views illustrative of the protecting circuit in accordance with the first embodiment of the present invention.

As illustrated in FIG. 1, in the first embodiment of the present invention, first of all, a protecting circuit 100 that is used between the standardized mechanical interface (SMIF) and the processing apparatus is provided. The protecting circuit 100 comprises: a voltage-induction device 110, such as a metal-oxide semiconductor (MOS), a logical device 120, such as a transistor-to-transistor logic (TTL), and a plurality of electric-lighting devices 130, wherein the voltage-induction device 110 comprises a plurality of not gates, a plurality of input points and plurality of output points; the logical device 120 comprises a plurality of or gates, a plurality of input points and plurality of output points; the plurality of electric-lighting devices comprises a light-emitting diode (LED). The plurality of input points of the voltage-induction device 110 are individually connected with a plurality of output terminals 140, whereby the voltage-induction device catch the singles from the plurality of output terminals 140 by way of using the voltage induction. Furthermore, the plurality of output points of the voltage-induction device 110 are individually connected with the plurality of input points of the logical device 120, so as to perform the logic calculation. A part of the output points of the logical device 120 are connected with the plurality of electric-lighting devices 130, so as to display the state of operating the processing apparatus, and the other of the output points of the logical device 120 are connected with a plurality of linking ports 150 in the standardized mechanical interface (SMIF) to transport the signals into the standardized mechanical interface (SMIF), and drive the current to control the operation of the apparatus with the standardized mechanical interface (SMIF).

Figure 2A:
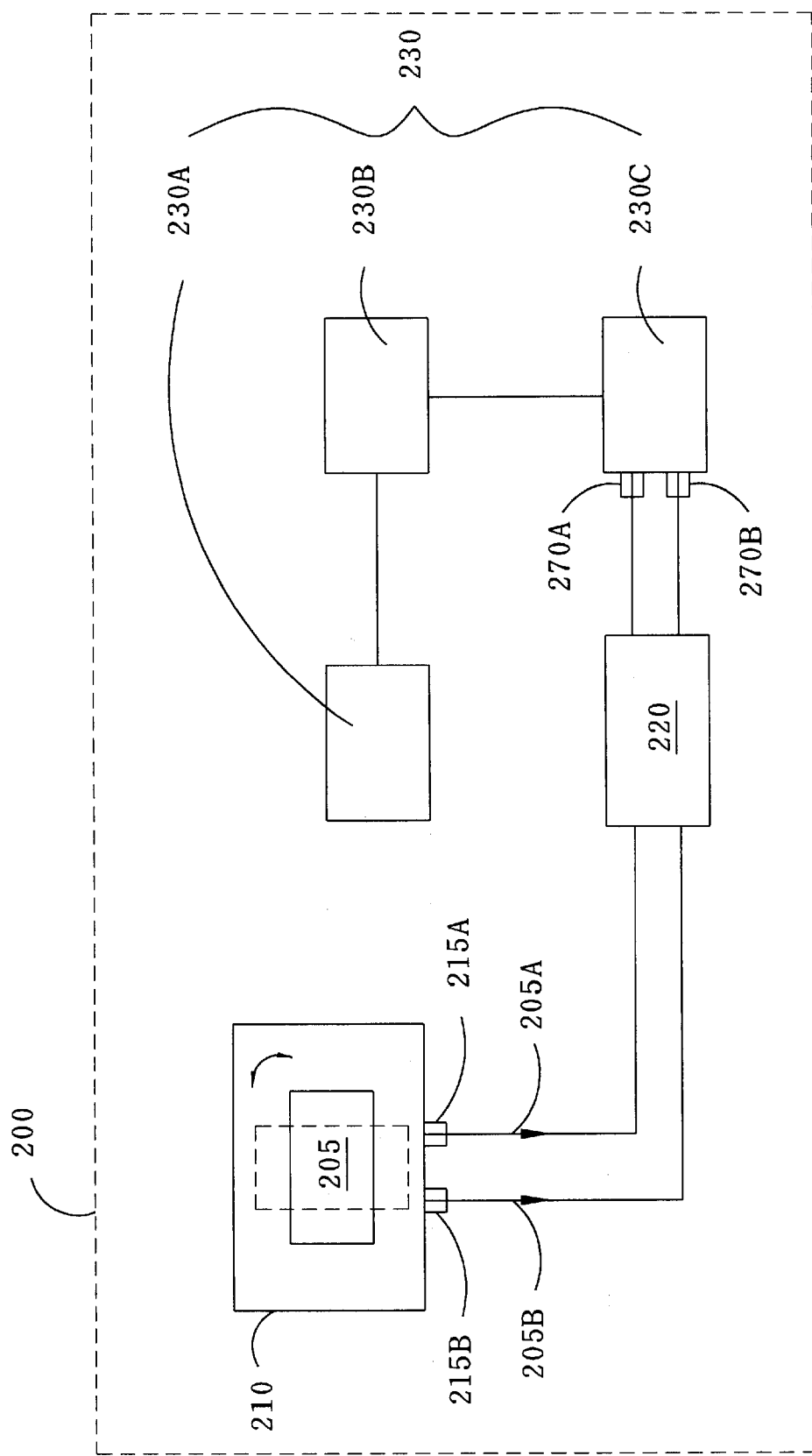
FIG.2A shows cross-sectional views illustrative of the system with the standardized mechanical interface (SMIF) and the protecting process in accordance with the second embodiment of the present invention.

As illustrated in FIG.2A, in the second embodiment of the present invention, first of all, a processing system 200 that is utilized in the semiconductor industry is provided, wherein the processing system 200 comprises a processing apparatus 210, a protecting circuit 220 and an automatic running apparatus 230 having the standardized mechanical interface (SMIF). The processing apparatus 210 comprises a carrying platform 205 that can free rotate itself, and the processing apparatus 210 itself can product two singles in accordance with the load/unload states: one signal is a goods-stated signal (Pr) 205A that is outputted from an output terminal 215A of the goods-stated signal (Pr) 205A; another signal is a stage-stated signal (H) 205B that is outputted from an output terminal 215B of the stage-stated signal(H)205B. When the carrying platform 205 has no any goods thereon, a goods-stated signal(Pr)205A that is transported from the processing apparatus 210 is ⌈1⌋, otherwise the goods-stated signal (Pr) 205A is ⌈0⌋. When the carrying platform 205 itself rotates to a direction that is not located on the site for carrying the goods, a stage-stated signal (H) 205B that is transported from the processing apparatus 210 is ⌈0⌋, otherwise the stage-stated signal (H) 205B is ⌈1⌋. Furthermore, the automatic running apparatus 230 with the standardized mechanical interface (SMIF) comprises: a robotic arm 230A, a placing means 230B and a circuit system 230C having a plurality of linking ports, wherein the plurality of linking ports comprise a unloading port 270A and a loading port 270B.

Figure 2B:
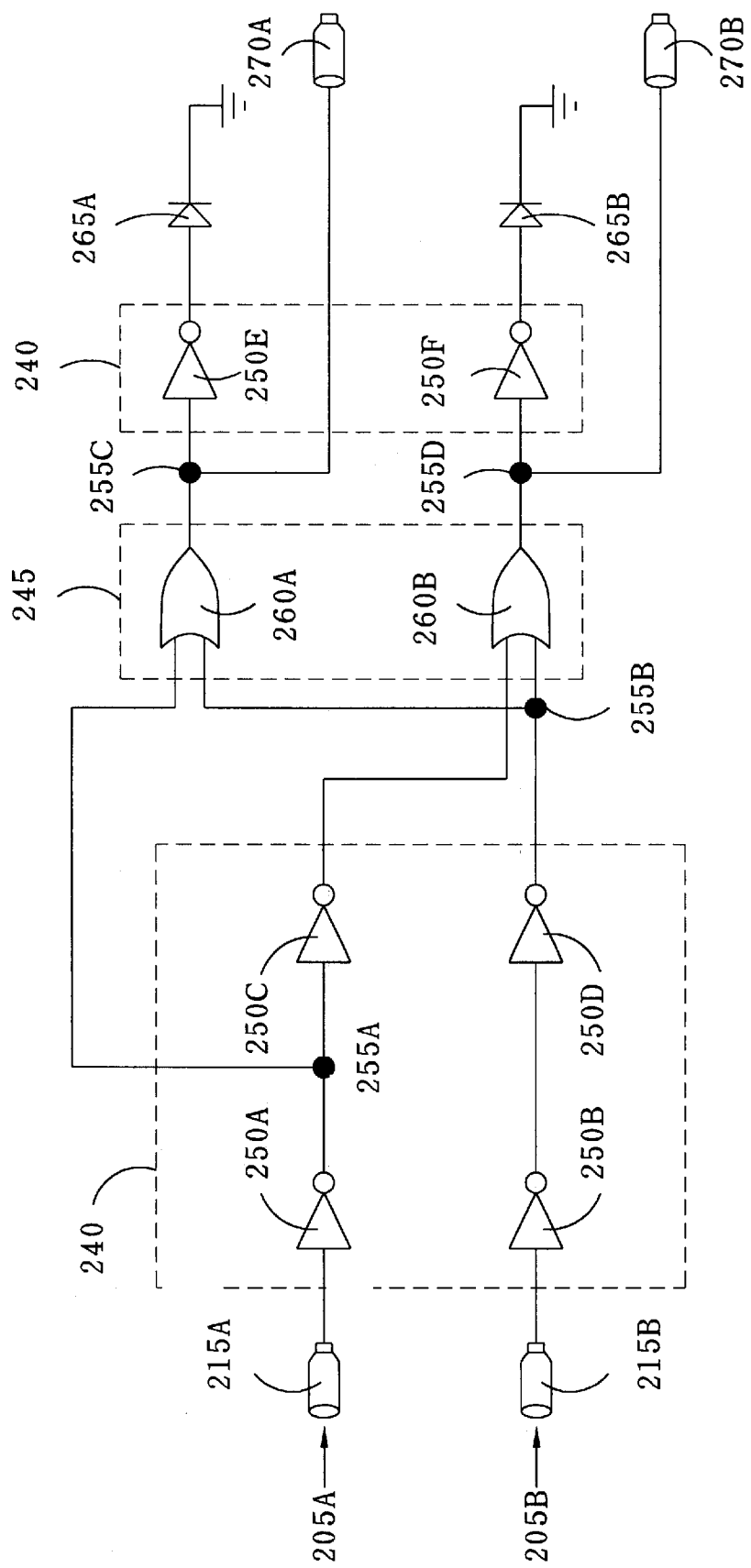
FIG.2B shows cross-sectional views illustrative of the protecting circuit in accordance with the second embodiment of the present invention.

As shown in FIG.2B, in this embodiment, the protecting circuit 220 comprises: a complementary metal-oxide semi-conductor device (CMOS) 240, a transistor-to-transistor logic device (TTL) 245 and two light-emitting diode devices (LED), wherein the complementary metal-oxide semiconductor device (CMOS) 240 comprises six not gates, and the transistor-to-transistor logic device (TTL) 245 comprises two or gates. An input point of the first not gate 250A is connected with the output terminal 215A of the goods-stated signal (Pr) 205A, and an input point of the second not gate 250B is connected with the 215B of the stage-stated signal (H) 205B, whereby the protecting circuit 220 can receive the singles from the processing apparatus 210. An output point of the first not gate 250A is connected with an input point of the third not gate 250C to form a first node 255A, and an output point of the second not gate 250B is connected with an input point of the fourth not gate 250D. An output point of the third not gate 250C is connected with one of two input points of the second or gate 260B, and an output point of the fourth not gate 250D is connected with another of two input points of the second or gate 260B to form a second node 255B. One of two input points of the first or gate 260A is connected with the first node 255A, and another of two input point of the first or gate 260A is connected with the second node 255B. An output point of the first or gate 260A is connected with an input point of the fifth not gate 250E to form a third node 255C, and an output point of the second or gate 260B is connected with an input point of the sixth not gate 250F to form a fourth node 255D. An input point of the first light-emitting diode (LED) 265A is connected with an output point of the fifth not gate 250E, and an input point of the second light-emitting diode(LED)265B is connected with an output point of the sixth not gate 250F. The third node 255C is connected with an unloading port 270A of the circuit system 230C, and the fourth node 255D is connected with a loading port 270B of the circuit system 230C.

As shown in FIG.2A and FIG.2B, in this embodiment, when the carrying platform 205 has no goods thereon and the carrying platform 205 itself rotates to a direction that is not located on the site for carrying the goods, the processing apparatus 210 produces a goods-stated signal 205A that is [0] and a stage-stated signal 205B that is [0]. Furthermore, the goods-stated signal 205A is transported through the output terminal 215A into the first not gate 250A, and stage-stated signal 205B is transported through the output terminal 215B into the second not gate 250B. Then the first not gate 250A transmits a signal that is [1] into the third not gate 250C, and the signal that is [1] is transported through the first node 255A into the first or gate 260A. At the same time, the second not gate 250B transmits a signal that is [1] into the fourth not gate 250D, and then the fourth not gate 250D transmits a signal that is [0] into the second or gate 260B, and the signal that is [0] is transported through the second node 255B into the first or gate 260A. The first or gate 260A transmits an unloading signal that is [1] in accordance with the inputted signals as above. At the same time, the unloading signal that is [1] is transported into the fifth not gate 250E, and then the unloading signal that is [1] is transported into the unloading port 270A of the circuit 230C through the third node 255C. The second or gate 260B transmits an loading signal that is [0] in accordance with the inputted signals as above. At the same time, the loading signal that is [0] is transported into the sixth not gate 250F, and then the loading signal that is [0] is transported into the loading port 270B of the circuit 230C through the third node 255C. Moreover, the fifth not gate 250E transmits the unloading signal that is [0] into the first light-emitting diode (LED) 265A, and the sixth not gate 250F transmits the loading signal that is [1] into the second light-emitting diode (LED) 265B. Furthermore, the first light-emitting diode (LED) 265A is used to show the state that is ready for unloading, so that the operator can accurately control the robotic arm 230A of the automatic running apparatus 230 in accordance with the first light-emitting diode (LED) 265A, so as to catch the goods on the carrying platform 205 and set in the placing means 230B of the automatic running apparatus 230. The second light-emitting diode (LED) 265B is used to show the state that is ready for loading, so that the operator can accurately control the robotic arm 230A of the automatic running apparatus 230 the second light-emitting diode (LED) 265B, so as to catch the goods in the placing means 230B of the automatic running apparatus 230 and set on the carrying platform 205.

In these embodiments of the present invention, as discussed above, when the carrying platform itself rotates to the direction that is located on the site for carrying the goods, the stage-stated signal(H) that is transported from the processing apparatus is [1], and then the protecting circuit performs a logical calculation to base on the stage-stated signal (H), so as to limit the robotic arm of the standardized mechanical interface (SMIF) to unworking, and all of the light-emitting diodes does not be lightened, so the operator can easily diagnose the system state. When the carrying platform has no goods thereon and the carrying platform itself rotates to a direction that is not located on the site for carrying the goods, the processing apparatus transmits a goods-stated signal (Pr) that is [0] and a stage-stated signal (H) that is [0], and then the protecting circuit performs a logical calculation to base on the stage-stated signal (H) and the goods-stated signal (Pr), so that the robotic arm of the standardized mechanical interface (SMIF) is workable, and the second light-emitting diodes is lightened, so the operator can easily diagnose the system state and operate the robotic arm of the standardized mechanical interface (SMIF) by the local control. On the other hand, when the carrying platform has goods thereon and the carrying platform itself rotates to a direction that is not located on the site for carrying the goods, the processing apparatus transmits a goods-stated signal (Pr) that is [1] and a stage-stated signal (H) that is ]0], and then the protecting circuit performs a logical calculation to base on the stage-stated signal (H) and the goods-stated signal (Pr), so that the robotic arm of the standardized mechanical interface (SMIF) is workable, and the first light-emitting diodes is lightened, so the operator can easily diagnose the system state and operate the robotic arm of the standardized mechanical interface (SMIF) by the local control.

As discussed above, this invention provides a protecting circuit system between the processing apparatus and standardized mechanical interface (SMIF). This invention can install a protecting circuit between the processing apparatus and standardized mechanical interface (SMIF) to avoid the miss-operation that cause damage to the equipments, and the protecting circuit also raise the stability for operating the equipments. Thus, this invention can reduce the maintainable cost of the conventional apparatus in order to correspond to economic effect. Therefore, the present invention is appropriate for deep sub-micron technology in providing semiconductor apparatus. The protecting circuit of the present invention can catch the outputted signals from the processing apparatus, and the outputted signals is logically calculated by way of using a logical device to produce a local controlling signal, the protecting circuit then transports the local controlling signal into the standardized mechanical interface (SMIF) to control the operation of the robotic arm. In order to avoid affecting the current that is used to operate the apparatus, the protecting circuit utilizes the metal-oxide semiconductor (MOS) device having the property of the voltage induction to catch the signals and the Transistor-to-Transistor Logic (TTL) having the property of the current induction to drive the equipment. Therefore, the present invention is a device that can correspond to the requirement of the industry.

Of course, it is possible to apply the present invention to the standardized mechanical interface (SMIF), and also it is possible to apply the present invention to any semiconductor apparatus having the robotic arm. Also, this invention can be applied to avoid the miss-operation between the processing apparatus and the robotic arm by the protecting circuit concerning the semiconductor factory automation has not been developed at present. The present invention is the best protecting circuit of the standardized mechanical interface (SMIF) compatible for deep sub-micro apparatus.

Obviously, many modifications and variations of the present invention are possible in light of the above teachings. It is therefore to be understood that within the scope of the appended claims, the present invention may be practiced other than as specifically described herein.

Although these specific embodiments have been illustrated and described, it will be obvious to those skilled in the art that various modifications may be made without departing from what is intended to be limited solely by the appended claims.

What is claimed is:

1. A protecting circuit adaptable to an automatic transport apparatus having a standardized mechanical interface, said protecting circuit comprising:
    a first output terminal for providing a first signal from a semiconductor process apparatus, indicating that at least a semiconductor object is placed on a supporting device of the semiconductor process apparatus;
    a second output terminal for providing a second signal from the semiconductor process apparatus, indicating that the supporting device is in a predefined fit position;
    a first sub-circuit coupled to receive said first signal and said second signal for generating a first output signal only when said first signal and said second signal are both inactive, wherein said generated first output signal is connected to the standardized mechanical interface, thereby denoting a status during which a loading is performed by the automatic transport apparatus; and
    a second sub-circuit coupled to receive said first signal and said second signal for generating a second output signal only when said first signal is active and said second signal is inactive, wherein said generated second output signal is connected to the standardized mechanical interface, thereby denoting a status during which an unloading is performed by the automatic transport apparatus.

2. The protecting circuit of claim 1, further comprising a first display device electrically coupled to said generated first output signal.

3. The protecting circuit of claim 2, further comprising a second display device electrically coupled to said generated second output signal.

4. A protecting circuit used in a standardized mechanical interface, said protecting circuit comprising:
    a voltage-induction device with a plurality of first input points and a plurality of first output points, wherein said voltage-induction device catches a plurality of inputting signals from an environment by way of using said plurality of first input points;
    a logical device with a plurality of second input points and a plurality of second output points, wherein said plurality of second input points of said logical device are connected with said plurality of first output points of said voltage-induction device, and a portion of said plurality of second output points of said logical device are connected with said plurality of ports of said standardized mechanical interface, said logical device can perform a logical calculation to drive said standardized mechanical interface; and
    a plurality of electric-lighting devices, said plurality of electric-lighting devices are connected with other said plurality of second output points of said logical device, wherein said plurality of electric-lighting devices are used to display the operating condition of said plurality of standardized mechanical interface.

5. The protecting circuit according to claim 4, wherein said voltage-induction device comprises a plurality of not gats.

6. The protecting circuit according to claim 4, wherein said logical device comprises a plurality of or gates.

7. A protecting circuit used in a standardized mechanical interface, said protecting circuit comprising:
    a first not gate, an output point of said first not gate is connected with an input point of a third not gate to form a first node;
    a second not gate, an output point of said second not gate is connected with an input point of a fourth not gate;
    a first or gate, one of input points of said first or gate is connected with said first node;
    a second or gate, one of input points of said second or gate is connected with an output point of said third not gate, and another of input points of said second or gate is connected with an output point of said fourth not gate to form a second node, wherein said second node is connected with another of input points of said first or gate;
    a fifth not gate, an input point of said fifth not gate is connected with an output point of said first or gate to form a third node, wherein said third node is connected with a portion of said plurality of ports of said standardized mechanical interface;
    a sixth not gate, an input point of said sixth not gate is connected with an output point of said second or gate to form a forth node, wherein said fourth node is connected with the other portion of said plurality of ports of said standardized mechanical interface;
    a first electric-lighting device, said first electric-lighting device is connected with an output point of said fifth not gate; and
    a second electric-lighting device, said second electric-lighting device is connected with an output point of said sixth not gate.

8. A protecting system of the semiconductor apparatus, said protecting system comprising:
    a processing apparatus with a carrying platform, a first signal output point and a second signal output point, said processing apparatus itself products a first signal in accordance with the goods state on said carrying platform and a second signal in accordance with the site of said carrying platform, wherein said first signal is outputted by said first signal output point, and said second signal is outputted by said second signal output point;
    an automatic running apparatus with a standardized mechanical interface, said automatic running apparatus has a robotic arm and a plurality of ports; and a protecting circuit with a plurality of voltage-induction devices, a plurality of logical devices and a plurality of electric-lighting devices, the input points of said plurality of voltage-induction devices are individually connected with said first signal output point and said second signal output point to receive said first signal and said second signal, the input points of said plurality of logical devices are connected with the output point of said plurality of voltage-induction devices to perform a logical calculation and output a loading signal and an unloading signal at the same time, a portion of the output points of said plurality of logical devices are connected with said plurality of ports of said automatic running apparatus to transport said loading signal and said unloading signal into said standardized mechanical interface, so as to control the operation of said robotic arm, wherein said plurality of electric-lighting devices are connected with said another portion of the output points of said plurality of logical devices to display the state of said carrying platform and the operating condition of said robotic arm.

9. The protecting system according to claim 8, wherein said carrying platform comprises a rotative carrying platform.

10. The protecting system according to claim 8, wherein said plurality of ports comprise an unloading port.

11. The protecting system according to claim 8, wherein said plurality of ports comprise a loading port.

* * * * *